(12) United States Patent
Kelaher et al.

(10) Patent No.: US 9,979,109 B2
(45) Date of Patent: May 22, 2018

(54) CARD STABILIZER BRACKET

(71) Applicant: Lenovo Enterprise Solutions (Singapore) Pte. Ltd., Singapore (SG)

(72) Inventors: Daniel P. Kelaher, Holly Springs, NC (US); Glenn E. Myrto, Holly Springs, NC (US); John P. Scavuzzo, Cary, NC (US); Paul Andrew Wormsbecher, Morrisville, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days. days.

(21) Appl. No.: 14/937,727

(22) Filed: Nov. 10, 2015

(65) Prior Publication Data

US 2017/0133776 A1   May 11, 2017

(51) Int. Cl.
| | | |
|---|---|---|
| *H01R 12/00* | (2006.01) | |
| *H01R 12/73* | (2011.01) | |
| *G06F 1/18* | (2006.01) | |
| *H05K 7/14* | (2006.01) | |
| *H01R 12/72* | (2011.01) | |

(52) U.S. Cl.
CPC .......... *H01R 12/737* (2013.01); *G06F 1/18* (2013.01); *H05K 7/1452* (2013.01); *H01R 12/721* (2013.01)

(58) Field of Classification Search
CPC .......... H01R 23/7068; H01R 13/631; H01R 23/7005; H01R 13/64; H01R 9/096; G06K 7/0021
USPC ... 439/59, 374, 377, 629, 630, 637, 680, 62, 439/65; 361/736, 748
See application file for complete search history.

(56) References Cited

U.S. PATENT DOCUMENTS

| | | | | |
|---|---|---|---|---|
| 5,440,755 A * | 8/1995 | Harwer | ..................... | H05K 1/14 710/105 |
| 5,622,505 A * | 4/1997 | Hashiguchi | .......... | H01R 12/716 439/260 |
| 5,706,179 A * | 1/1998 | Palatov | ..................... | G06F 1/18 361/726 |
| 5,754,796 A * | 5/1998 | Wang | ..................... | G06F 13/409 439/74 |
| 5,872,701 A * | 2/1999 | Hayden, Sr. | .......... | H05K 7/1454 361/741 |
| 5,889,656 A * | 3/1999 | Yin | ..................... | H01R 12/7005 361/740 |
| 5,954,530 A * | 9/1999 | Ichimura | ................ | H01R 12/87 439/260 |
| 5,980,277 A * | 11/1999 | Ichimura | ................ | H01R 12/88 439/141 |
| 5,984,704 A * | 11/1999 | Hashiguchi | ............ | H01R 12/87 439/260 |
| 6,030,230 A | 2/2000 | Peacock | | |
| 6,146,184 A | 11/2000 | Wilson et al. | | |

(Continued)

*Primary Examiner* — Thanh Tam Le
(74) *Attorney, Agent, or Firm* — Zilka-Kotab, P.C.

(57) ABSTRACT

A product, according to one embodiment, includes a support portion, the support portion being elongated in a first direction; and an insertion portion extending from the support portion in a second direction orthogonal to the first direction, the insertion portion having dimensions allowing insertion of the insertion portion in a card connector of a circuit board. At least an exterior of the insertion portion is electrically insulating. The support portion is wider than the insertion portion in a third direction orthogonal to each of the first and second directions.

17 Claims, 5 Drawing Sheets

(56) References Cited

U.S. PATENT DOCUMENTS

| | | | |
|---|---|---|---|
| 6,227,898 B1 * | 5/2001 | Meng | H01R 13/645 439/374 |
| 6,287,129 B1 | 9/2001 | Kuo | |
| 6,307,754 B1 | 10/2001 | Le et al. | |
| 6,371,781 B1 * | 4/2002 | Jones | H01R 12/87 439/260 |
| 6,435,897 B1 * | 8/2002 | Paul | H01R 12/7005 439/374 |
| 6,504,725 B1 * | 1/2003 | Lam | G06F 1/184 361/737 |
| 6,629,855 B1 | 10/2003 | North et al. | |
| 6,762,942 B1 * | 7/2004 | Smith | H05K 1/189 174/258 |
| 6,824,410 B1 | 11/2004 | Co et al. | |
| 6,887,095 B2 * | 5/2005 | Simon | H01R 9/2475 439/260 |
| 6,916,202 B2 | 7/2005 | Maue et al. | |
| 7,121,836 B2 * | 10/2006 | Lai | H01R 12/721 439/59 |
| 7,255,570 B1 * | 8/2007 | Feldman | G06F 13/409 439/377 |
| 7,331,809 B2 * | 2/2008 | Lee | H01R 12/7011 439/327 |
| 7,410,383 B2 * | 8/2008 | Hsieh | H01R 13/629 439/374 |
| 7,494,361 B2 | 2/2009 | Ho | |
| 8,035,408 B1 | 10/2011 | Co | |
| 8,113,850 B2 * | 2/2012 | Liao | G06F 1/185 361/736 |
| 8,348,694 B2 | 1/2013 | Kah | |
| 8,369,095 B2 * | 2/2013 | Park | H01M 2/04 361/748 |
| 8,414,305 B2 * | 4/2013 | Sun | H01R 12/721 439/62 |
| 8,439,706 B2 | 5/2013 | Sytsma et al. | |
| 8,585,422 B2 * | 11/2013 | Balcerak | H01R 13/514 439/215 |

\* cited by examiner

US 9,979,109 B2

CARD STABILIZER BRACKET

FIELD OF THE INVENTION

The present invention relates to support brackets, and more particularly, this invention relates to support bracket for stabilizing cards in a computing environment.

BACKGROUND

The primary add-in adapter card form factor for computing devices is now the PCI Express (PCIe) specification which specifies four different lengths of connectors. Most system designers design to allow cards with smaller bandwidths, e.g., x4 or x8, to fit into the longest x16 connector on a server system board. However, when a card is installed in a connector that is longer than the card edge connector, the installed card is unstable and has a tendency to want to rock out of the connector, which in turn can cause the card to function incorrectly, e.g., due to loss of connectivity.

Present methods of dealing with this are to have retention on both ends of the topside of the card, or to fasten the card into the chassis with screws. Screwing down the card takes extra time for service and installation, while adding front side retention on the card requires extra parts and space within the chassis.

The PCIe x16 card specification contains a feature that extends down in front of the front end of the connector to latch into a latch that is connected to the slot, but this feature is not present on many adapter cards.

What is needed in the industry is a method to ensure any PCIe adapter card stays vertical, i.e., does not rock out of the slot, and can still use quick toolless methods to retain the card within the slot.

SUMMARY

A product, according to one embodiment, includes a support portion, the support portion being elongated in a first direction; and an insertion portion extending from the support portion in a second direction orthogonal to the first direction, the insertion portion having dimensions allowing insertion of the insertion portion in a card connector of a circuit board. At least an exterior of the insertion portion is electrically insulating. The support portion is wider than the insertion portion in a third direction orthogonal to each of the first and second directions.

A product, according to another embodiment, includes a support portion, the support portion being elongated in a first direction; and an insertion portion extending from the support portion in a second direction orthogonal to the first direction, the insertion portion having dimensions allowing insertion of the insertion portion in a card connector of a circuit board. At least an exterior of the insertion portion is electrically insulating. The support portion is wider than the insertion portion in a third direction orthogonal to each of the first and second directions. The support portion has at least one narrow portion for allowing separation of the support portion into discrete sections.

Other aspects and advantages of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of a support bracket insertable in a card connector of a circuit board, such as a PCIe slot or the like, to provide a horizontal surface that supports a free end of a card inserted in the card connector. Related systems and methods are also presented. In one illustrative embodiment, a vertical support bracket that mates with a PCIe connector to fill the portion of the connector slot that is not filled when the PCIe card is installed. The top "support" portion of the vertical support bracket provides a horizontal surface or platform to support the portion of PCIe card not inserted into the connector. In some approaches, the support bracket can be separated into sections, e.g., so that it fits within x4, x8, and x16 card connector slots.

In one general embodiment, a product includes a support portion, the support portion being elongated in a first direction; and an insertion portion extending from the support portion in a second direction orthogonal to the first direction, the insertion portion having dimensions allowing insertion of the insertion portion in a card connector of a circuit board. At least an exterior of the insertion portion is electrically insulating. The support portion is wider than the insertion portion in a third direction orthogonal to each of the first and second directions.

In another general embodiment, a product, includes a support portion, the support portion being elongated in a first direction; and an insertion portion extending from the support portion in a second direction orthogonal to the first direction, the insertion portion having dimensions allowing insertion of the insertion portion in a card connector of a circuit board. At least an exterior of the insertion portion is electrically insulating. The support portion is wider than the insertion portion in a third direction orthogonal to each of the first and second directions. The support portion has at least one narrow portion for allowing separation of the support portion into discrete sections.

Figure 1:
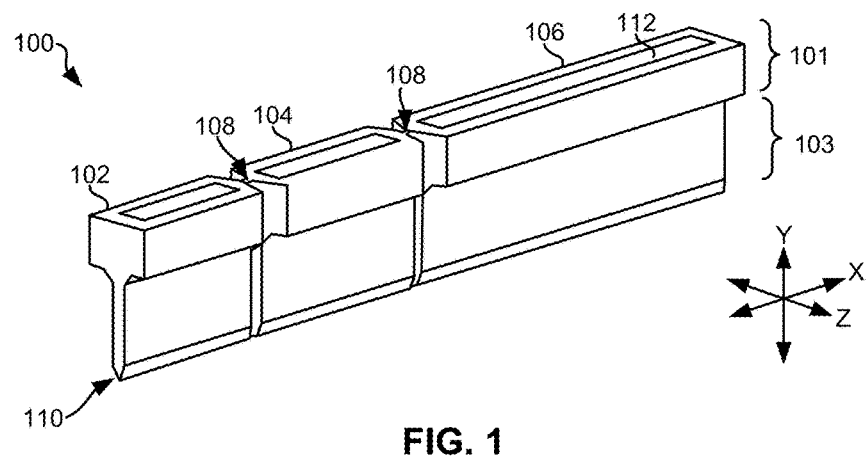
FIG. 1 depicts a perspective view of a bracket according to one embodiment.
Figure 2:
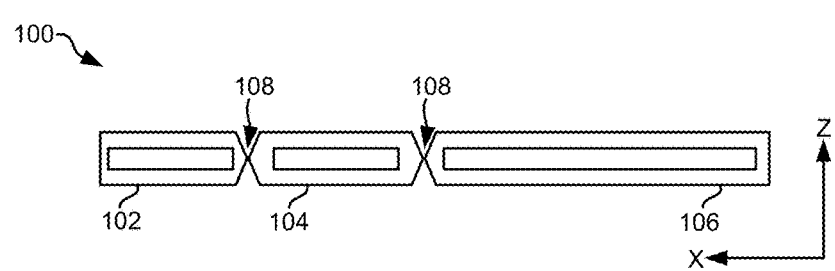
FIG. 2 depicts a top view of the bracket of FIG. 1.
Figure 3:
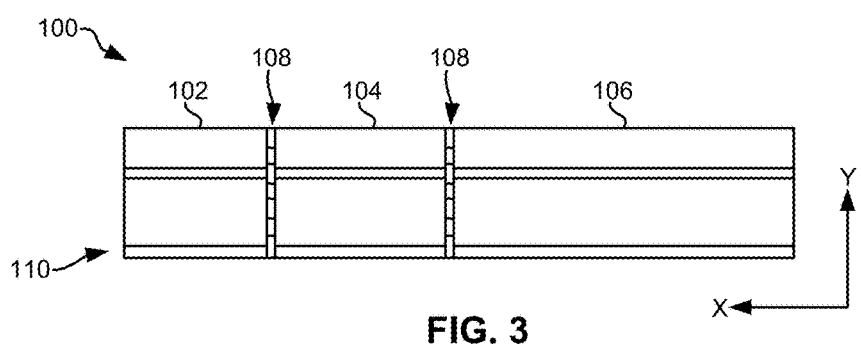
FIG. 3 depicts a side view of the bracket of FIG. 1.

FIGS. 1, 2 and 3 depict perspective, top and side views, respectively, of a bracket 100 according to one embodiment. The bracket includes a support portion 101 that is elongated in a first direction X.

An insertion portion 103 extends downwardly from the support portion 101 in a second direction Y orthogonal to the first direction X. The insertion portion 103 has dimensions allowing insertion thereof in a card connector of a circuit board, as will be described in detail below. Preferably, the free end 110 of the insertion portion 103 is tapered to assist in insertion thereof into the slot of the card connector. Moreover, the width of the insertion portion 103 may be less than a width of the slot of the card connector, but preferably is about as wide as the slot to create a snug fit when inserted therein, which may secure the bracket to the card connector via frictional coupling.

At least an exterior of the insertion portion 103 is electrically insulating to prevent shorting of the contact pads in the card connector. The exterior of the insertion portion 103 may thus be covered by an insulating material. However, in a preferred embodiment, the insertion portion 103 is constructed of an insulating material of a type known in the art, such as a plastic, alumina, etc.

Figure 4:
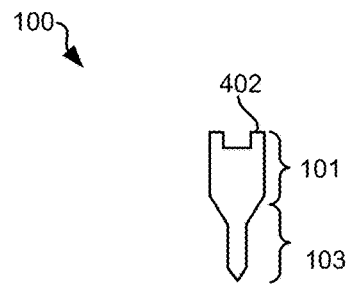
FIG. 4 depicts an end view of a bracket according to one embodiment.

As best seen in FIG. 1, the support portion 101 is wider than the insertion portion 103 in a third direction Z orthogonal to each of the first and second directions X, Y. This wider configuration provides improved support for a card resting thereon. The upper surface of the support portion 101 may be flat, may have features such as apertures 112, e.g., to reduce stress-induced cracking or from injection molding; nubs, fingers, crenellations, etc. to engage portions of the card; wings 402 as shown in FIG. 4 extending along the second direction Y, thereby defining a channel for receiving an edge of a card therein between the wings 402; etc. In some embodiments, the support portion 101 is at least twice as wide as the insertion portion 103 in the third direction Z.

Figure 5:
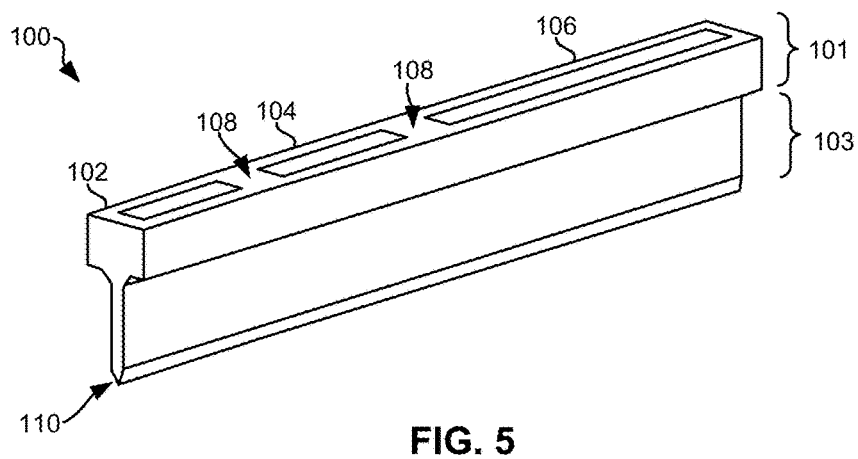
FIG. 5 depicts a perspective view of a bracket according to one embodiment.

FIG. 5 depicts an embodiment of the bracket that has no separable sections. However, in preferred embodiments, the support portion 101 may have one or more narrow portions 108 for allowing separation of the support portion 101 into discrete sections, e.g., sections 102, 104, 106 of FIG. 1. The narrow portion 108 preferably extends along the insertion portion 103 as well to make separation into the segments easier.

In one approach, only one narrow portion 108 may be present. In other approaches, multiple narrow portions 108 may be present to allow selection of the remaining size of the bracket for the given application. For example, two, three or more narrow portions 108 may be present to enable separation of the support portion 101 into two, three or more discrete sections.

Referring to FIG. 2, sidewalls of the support portion 101 adjacent each narrow portion 108 may taper together towards the narrow portion 108, and as such, are configured to engage one another upon bending of the bracket along the narrow portion 108, thereby inducing a stress separation at the narrow portion 108.

The lengths of the separable segments may be selected at design time for the expected application. In some embodiments, lengths of the support portion 101 between the narrow portions 108 are different. As shown in FIG. 2, longer of the segment lengths are about integer multiples of a shortest of the lengths, the integer being greater than 1.

For example, the PCI Express specification specifies four different lengths of connectors, though many cards with smaller bandwidths, e.g., x4 or x8, are designed to fit into and operate with the longest x16 connector on a server system board. According to various embodiments, if the length of section 102 corresponds to a x4 PCIe pad section or slot, section 104 may correspond to an x8 PCIe pad section or slot and section 106 may correspond to a x16 PCIe pad section or slot.

In use, one may break the bracket at the desired narrow portion 108 to acquire a bracket having the size appropriate for the application. For example, section 106 may be installed in a slot of a connector on a server system board when installing a x8 card into a x16 slot. According to another example, section 102 may be broken off at narrow portion 108, leaving sections 104 and 106 to be installed in a slot of a connector on a server system board when installing a x4 card into a x16 slot. According to yet another example, when installing a x1 PCIe card into a x16 slot, sections 102, 104, and 106 may preferably all be kept together as one part, e.g. not be broken off at narrow portion 108, and installed into the x16 slot.

Further examples of use may include removing sections 104 and 106, and placing section 102 into a x4 slot when installing a x1 card; removing sections 102 and 106, and placing section 104 into a x8 slot when installing a x4 card; and removing section 106, and placing sections 102 and 104 into a x8 slot when installing a x1 card.

Also, the dimensions of the bracket 100 and/or its sections, as well as the number of sections provided on the bracket may be selected to be compatible with many different technologies in the many combinations and permutations of features in various embodiments. Thus, the specifications of the plethora of possible embodiments falling within the spirit and scope of the present invention may vary from those of the exemplary embodiments presented herein.

The bracket may be constructed of any of a plethora of materials. As noted above, the insertion portion 103 is preferably electrically insulative, at least along an outer surface thereof. The support portion 101 and insertion portion 103 may be of unitary construction such as formed by injection molding, stamping, machining of a block of material, etc. Those skilled in the art will appreciate that various shapes, materials, and fabrication techniques may be used in various permutations of the present invention. In one illustrative approach, molded plastic is used to fabricate the bracket. Slots, e.g., as shown in FIG. 1, may be provided to reduce the possibility of stress fracturing.

FIGS. 6-9 depict illustrative systems 600, 800 implementing a bracket 100, in accordance with various embodiments. As an option, the present systems 600, 800 may be implemented in conjunction with features from any other embodiment listed herein, such as those described with reference to the other FIGS. Of course, however, such systems 600, 800 and others presented herein may be used in various applications and/or in permutations which may or may not be specifically described in the illustrative embodiments listed herein. Further, the systems 600, 800 presented herein may be used in any desired environment.

Figure 6:
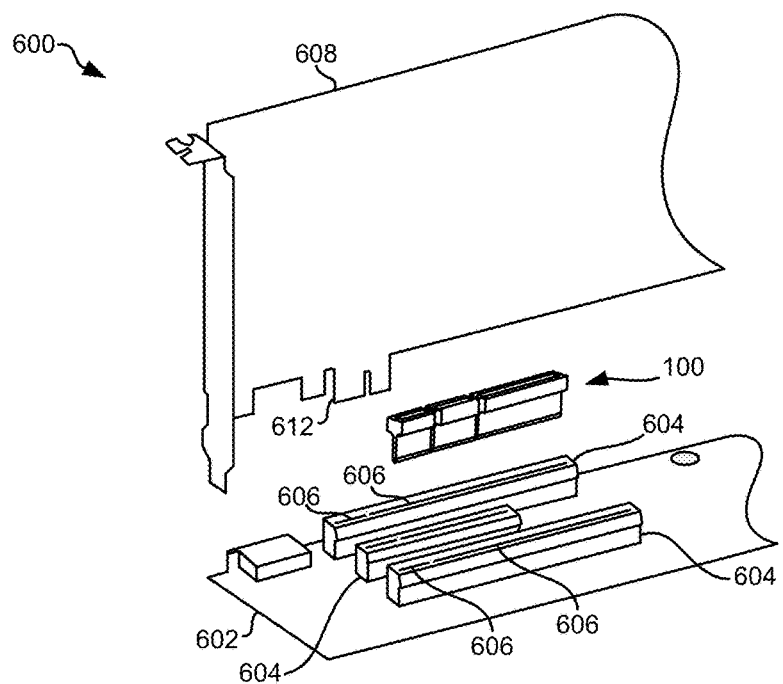
FIG. 6 depicts an exploded view of a system according to one embodiment.
Figure 7:
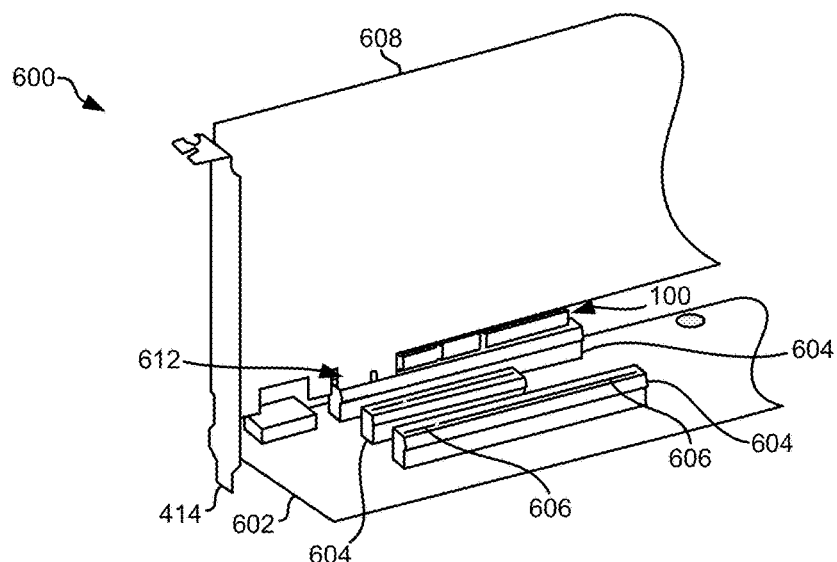
FIG. 7 depicts an assembled view of the system of FIG. 6.
Figure 8:
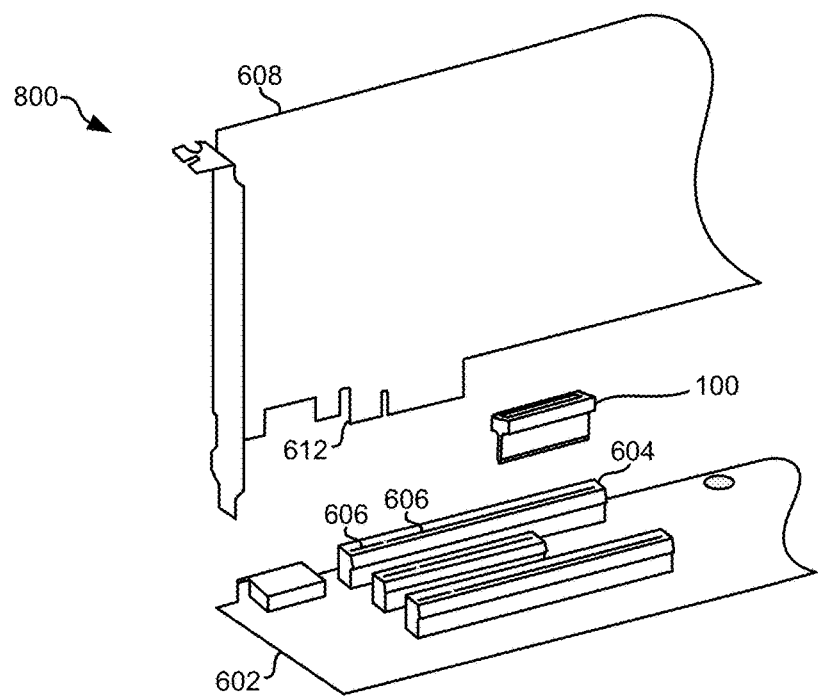
FIG. 8 depicts an exploded view of a system according to one embodiment.
Figure 9:
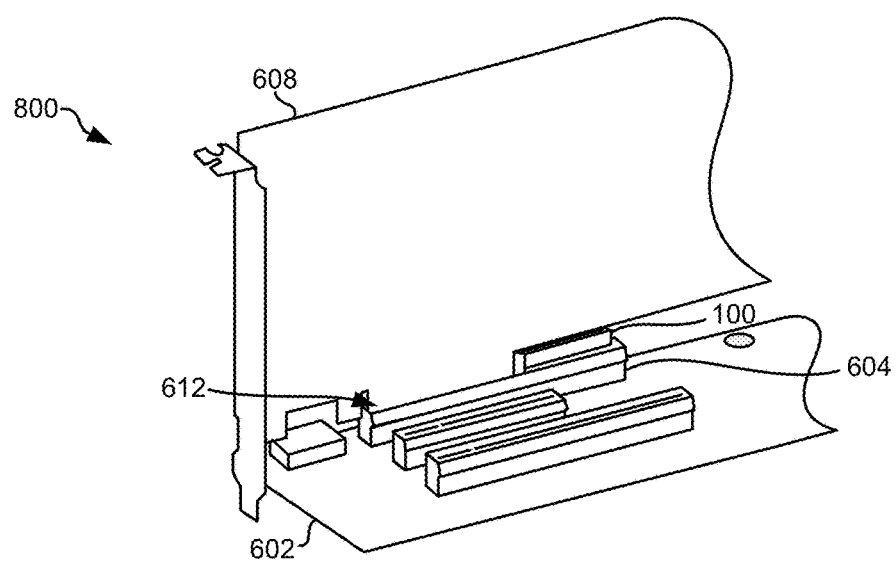
FIG. 9 depicts an assembled view of the system of FIG. 8.

Referring to FIGS. 6 and 7, there is shown a circuit board 602, e.g., a motherboard, having the card connector 604. In one illustrative example, the card connector 604 may be a x16 PCIe card connector, as depicted. The insertion portion of the bracket 100 is inserted in a slot 606 of the card connector 604, as shown in FIG. 7. As shown, the insertion portion extends only along a portion of the slot 606.

The bracket 100 slides into the end of the PCIe connector on the circuit board 602 (the end away from the rear bulkhead on the left) to fill the part of the connector not filled by the card to be installed. The wide section on the top of the bracket 100 provides a platform to support the card.

The connective portion 612 of a card 608, e.g., a PCIe x1 card 608 as depicted, is inserted in the slot 606 of the card 608 connector. The card 608 rests on the support portion of the bracket 100 when the card 608 is fully inserted in the slot 606. Because the illustrative card 608 is an x1 card 608, the full length of the bracket 100 is used. The card 608 now cannot rock forward and backward within the slot 606, thereby maintaining stable electrical connections between the card 608 and the contacts in the card connector 604 on the circuit board 602.

Where a different length of the bracket 100 is appropriate, the bracket 100 may be broken into smaller segments appropriate for the application. Thus, one end of the bracket 100 may have physical characteristics of a section thereof having been removed. Such characteristics may include stretched plastic, discoloration, an edge characteristic of breakage, etc. An example of use of a segment of the bracket 100 is provided in FIGS. 8 and 9, which depict a system 800 where a PCIe x8 card 608 and an x8 length segment of the bracket 100 are installed into an x16 PCIe slot 606.

Figure 10:
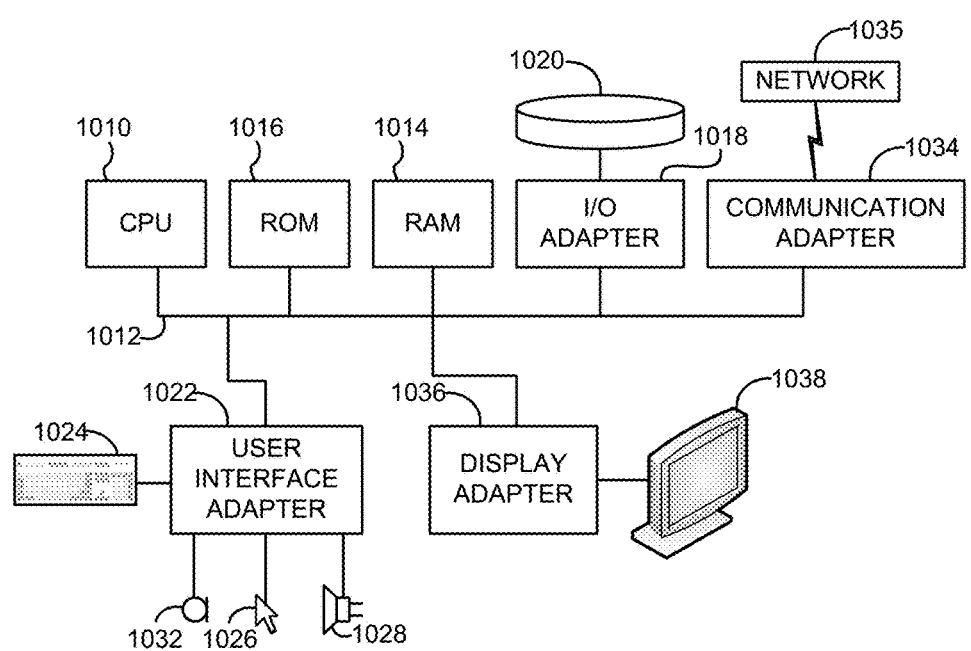
FIG. 10 is a system diagram of a representative hardware environment, in accordance with one embodiment.

FIG. 10 shows a representative hardware environment, in accordance with one embodiment. Such figure illustrates a typical hardware configuration of a workstation having a central processing unit 1010, such as a microprocessor, and a number of other units interconnected via a system bus 1012.

The workstation shown in FIG. 10 includes a Random Access Memory (RAM) 1014, Read Only Memory (ROM) 1016, an I/O adapter 1018 for connecting peripheral devices such as disk storage units 1020 to the bus 1012, a user interface adapter 1022 for connecting a keyboard 1024, a mouse 1026, a speaker 1028, a microphone 1032, and/or other user interface devices such as a touch screen and a digital camera (not shown) to the bus 1012, communication adapter 1034 for connecting the workstation to a communication network 1035 (e.g., a data processing network) and a display adapter 1036 for connecting the bus 1012 to a display device 1038.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A product, comprising:
   a support portion, the support portion being elongated in a first direction,
   wherein the support portion has a narrow portion for allowing separation of the support portion into discrete sections,
   wherein sidewalls of the support portion adjacent the narrow portion taper together toward the narrow portion, wherein the sidewalls adjacent the narrow portion are configured to engage one another upon bending of the support portion at the narrow portion thereby inducing a stress separation at the narrow portion; and
   an insertion portion extending from the support portion in a second direction orthogonal to the first direction, the insertion portion having dimensions allowing insertion of the insertion portion in a card connector of a circuit board,
   wherein at least an exterior of the insertion portion is electrically insulating, and
   wherein the support portion is wider than the insertion portion in a third direction orthogonal to each of the first and second directions.

2. The product of claim 1, wherein the support portion has multiple narrow portions for allowing separation of the support portion into at least three discrete sections.

3. The product of claim 2, wherein lengths of the support portion between the narrow portions are different, wherein a longer one of the lengths is about an integer multiple of a shorter of the lengths, the integer being greater than 1.

4. The product of claim 1, wherein the support portion and the insertion portion are a unitary construction, wherein the support portion is electrically insulating.

5. The product of claim 1, wherein the support portion is at least twice as wide as the insertion portion in the third direction.

6. The product of claim 1, wherein the support portion includes wings extending along the second direction, thereby defining a slot for receiving an edge of a card therein.

7. The product of claim 1, wherein the card connector is a peripheral component interconnect express (PCIe) connector.

8. A system, comprising:
   the circuit board having the card connector; and
   the insertion portion of the product of claim 1 inserted in a slot of the card connector, the insertion portion extending only along a portion of the slot.

9. The system of claim 8, comprising a card inserted in the slot of the card connector, the card resting on the support portion.

10. The system of claim 8, wherein the card connector is a PCIe connector.

11. The system of claim 8, wherein an end of the product has physical characteristics of a section thereof having been removed.

12. A method, comprising:
    breaking the product of claim 1 into discrete sections;
    inserting one of the sections in the card connector of the circuit board; and
    inserting a card in the card connector of the circuit board.

13. A product, comprising:
    a support portion, the support portion being elongated in a first direction; and
    an insertion portion extending from the support portion in a second direction orthogonal to the first direction, the insertion portion having dimensions allowing insertion of the insertion portion in a card connector of a circuit board,
    wherein at least an exterior of the insertion portion is electrically insulating,
    wherein the support portion is wider than the insertion portion in a third direction orthogonal to each of the first and second directions, wherein the support portion has at least one narrow portion for allowing separation of the support portion into discrete sections, and wherein sidewalls of the support portion adjacent the narrow portion taper together toward the narrow portion, wherein the sidewalls adjacent the narrow portion are configured to engage one another upon bending of the support portion at the narrow portion thereby inducing a stress separation at the narrow portion.

14. The product of claim 13, wherein the support portion has multiple narrow portions for allowing separation of the support portion into at least three discrete sections.

15. The product of claim 14, wherein lengths of the support portion between the narrow portions are different, wherein longer of the lengths are about integer multiples of a shortest of the lengths, the integer being greater than 1.

16. The product of claim 13, wherein the support portion is at least twice as wide as the insertion portion in the third direction.

17. The product of claim 13, wherein the support portion includes wings extending along the second direction, thereby defining a slot for receiving an edge of a card therein, wherein an entire exterior of the insertion portion is electrically insulating.

* * * * *